(12) United States Patent
Yoshida

(10) Patent No.: US 8,809,694 B2
(45) Date of Patent: Aug. 19, 2014

(54) CIRCUIT MODULE

(75) Inventor: Masato Yoshida, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 187 days.

(21) Appl. No.: 13/535,387

(22) Filed: Jun. 28, 2012

(65) Prior Publication Data

US 2013/0020119 A1    Jan. 24, 2013

(30) Foreign Application Priority Data

Jul. 19, 2011    (JP) ................. 2011-158009

(51) Int. Cl.

| | | |
|---|---|---|
| *H05K 1/16* | (2006.01) | |
| *H05K 3/28* | (2006.01) | |
| *H01L 23/00* | (2006.01) | |
| *H01L 23/538* | (2006.01) | |
| *H05K 1/02* | (2006.01) | |
| *H01L 21/56* | (2006.01) | |
| *H01L 23/552* | (2006.01) | |
| *H05K 3/00* | (2006.01) | |
| *H01L 23/31* | (2006.01) | |
| *H01L 23/498* | (2006.01) | |

(52) U.S. Cl.
CPC ...... *H05K 1/0218* (2013.01); *H05K 2203/1316* (2013.01); *H05K 3/284* (2013.01); *H01L 24/97* (2013.01); *H01L 23/5389* (2013.01); *H01L 2224/48091* (2013.01); *H01L 2224/97* (2013.01); *H05K 3/0052* (2013.01); *H01L 2924/19105* (2013.01); *H05K 2201/0715* (2013.01); *H01L 2224/16225* (2013.01); *H01L 23/3121* (2013.01); *H01L 2224/48227* (2013.01); *H01L 21/561* (2013.01); *H01L 23/552* (2013.01); *H01L 23/49822* (2013.01)
USPC .......... 174/260; 174/377; 361/309; 361/728; 361/748; 257/659; 257/660; 438/50; 438/114; 439/607.01

(58) Field of Classification Search
CPC ... H01K 1/0218; H01K 1/0215; H01K 1/023; H01K 1/185; H05K 3/284; H01C 1/06; H01L 2224/73265; H01G 2/22; H01R 13/6594
USPC .................. 174/260, 377; 361/309, 728, 748; 257/659, 660; 438/50, 114; 439/607.01
See application file for complete search history.

(56) References Cited

U.S. PATENT DOCUMENTS

| | | | | |
|---|---|---|---|---|
| 5,929,517 | A  * | 7/1999 | Distefano et al. ............. | 257/707 |
| 6,538,196 | B1 * | 3/2003 | MacDonald et al. ......... | 174/377 |
| 8,018,033 | B2 * | 9/2011 | Moriya ......................... | 257/659 |
| 8,084,300 | B1 * | 12/2011 | San Antonio et al. ........ | 438/114 |

(Continued)

FOREIGN PATENT DOCUMENTS

| | | |
|---|---|---|
| JP | 03-042896 A | 2/1991 |
| JP | 08-186978 A | 7/1996 |
| JP | 2004-172176 A | 6/2004 |

*Primary Examiner* — Xiaoliang Chen
(74) *Attorney, Agent, or Firm* — Keating & Bennett, LLP

(57) ABSTRACT

A circuit module includes a substrate that has a substantially rectangular parallelepiped shape and includes a plurality of inner conductive layers, an electronic component disposed on a first main surface of the substrate, an insulating layer disposed on the first main surface of the substrate so as to cover the electronic component, a shielding layer disposed on a surface of the insulating layer, and a ground electrode connected to the plurality of inner conductive layers. At least two of the inner conductive layers are directly connected to the shielding layer.

7 Claims, 7 Drawing Sheets

(56) References Cited

U.S. PATENT DOCUMENTS

| | | | |
|---|---|---|---|
| 8,315,060 B2* | 11/2012 | Morikita et al. | 361/748 |
| 8,378,466 B2* | 2/2013 | Chiu et al. | 257/660 |
| 2003/0076659 A1* | 4/2003 | Ichitsubo et al. | 361/748 |
| 2004/0041256 A1* | 3/2004 | Takehara et al. | 257/712 |
| 2005/0248909 A1* | 11/2005 | Kikuchi et al. | 361/309 |
| 2006/0148317 A1* | 7/2006 | Akaike et al. | 439/607 |
| 2007/0082421 A1* | 4/2007 | Minervini | 438/50 |
| 2008/0277775 A1* | 11/2008 | Honer et al. | 257/698 |
| 2009/0001553 A1* | 1/2009 | Pahl et al. | 257/704 |
| 2009/0091904 A1* | 4/2009 | Hatanaka et al. | 361/764 |
| 2010/0157545 A1* | 6/2010 | Lehtimaki et al. | 361/728 |
| 2011/0006408 A1* | 1/2011 | Liao | 257/660 |
| 2011/0013349 A1* | 1/2011 | Morikita et al. | 361/679.02 |
| 2011/0186943 A1* | 8/2011 | Pahl et al. | 257/416 |

* cited by examiner

CIRCUIT MODULE

BACKGROUND OF THE INVENTION

1. Field of the Invention

The present invention relates to circuit modules, and, more particularly, to a circuit module in which a shielding layer disposed on a surface of an insulating layer covering an electronic component disposed on a substrate has a small thickness.

2. Description of the Related Art

In circuit modules in which an electronic component is disposed on a substrate and an insulating layer covers the electronic component, a shielding layer is sometimes formed on the surface of the insulating layer. Because of the shielding effect of the shielding layer, the electronic component disposed on the substrate is prevented from externally receiving electrostatic noise and failing to function normally, or is prevented from externally transmitting electrostatic noise.

Japanese Unexamined Patent Application Publication No. 2004-172176 discloses such a circuit module. FIG. 7 is a diagram illustrating a circuit module 300 disclosed in Japanese Unexamined Patent Application Publication No. 2004-172176.

The circuit module 300 includes a substrate 101. In the substrate 101, an inner conductive layer 102 and a via conductor 103 are formed. On one main surface of the substrate 101, a connection electrode 104 is formed. On the other main surface of the substrate 101, a terminal electrode 105 and a ground electrode 106 are formed. The connection electrode 104 and the inner conductive layer 102 are connected to each other through the via conductor 103, and the inner conductive layer 102 and the ground electrode 106 are connected to each other through the via conductor 103.

On one main surface of the substrate 101, a plurality of electronic components 107 are disposed. The electronic components 107 are connected via a predetermined wiring line (not illustrated) and form an electronic circuit. A predetermined portion of the electronic circuit extends to the terminal electrode 105 and the ground electrode 106.

On one main surface of the substrate 101, an insulating layer 108 made of a resin is formed so that it covers the electronic components 107. The insulating layer 108 is not formed on the entire main surface of one main surface of the substrate 101, and instead is only formed on a portion of one main surface of the substrate 101.

On the surface of the insulating layer 108, a shielding layer 109 is formed. For example, the shielding layer 109 is formed by molding a conductive resin.

In the circuit module 300 in the related art, however, a combined resistance generated by the shielding layer 109 and the inner conductive layer 102 is large. Accordingly, electrostatic noise externally received by the shielding layer 109 cannot be sufficiently grounded and an inner circuit may be affected by the electrostatic noise. In addition, electrostatic noise generated by the inner circuit in the circuit module 300 cannot be sufficiently grounded, and the electrostatic noise may be externally transmitted.

SUMMARY OF THE INVENTION

In view of the above-described problems, a circuit module according to a preferred embodiment of the present invention includes a substrate that has a substantially rectangular parallelepiped shape and includes a plurality of inner conductive layers, an electronic component disposed on a first main surface of the substrate, an insulating layer disposed on the first main surface of the substrate so as to cover the electronic component, a shielding layer disposed on a surface of the insulating layer, and a ground electrode connected to the plurality of inner conductive layers. At least two of the plurality of inner conductive layers are directly connected to the shielding layer.

At least two of the plurality of inner conductive layers directly connected to the shielding layer may be exposed on end surfaces of the substrate which face each other, and exposed portions of the inner conductive layers may be directly connected to the shielding layer. Alternatively, at least two of the plurality of inner conductive layers directly connected to the shielding layer may be exposed on three or four end surfaces of the substrate, and exposed portions of the inner conductive layers may be directly connected to the shielding layer.

The insulating layer may be formed on an entire main surface of the substrate.

The ground electrode may be formed on a second main surface of the substrate on which the electronic component is not disposed.

An additional electronic component may be disposed on the second main surface of the substrate on which the electronic component is not disposed. An additional insulating layer may be disposed on the second main surface of the substrate so that the additional insulating layer covers the additional electronic component. The ground electrode may be disposed on a surface of the additional insulating layer. In this case, many electronic components can be disposed on the substrate, and a sophisticated circuit module including a complex electronic circuit can be provided.

At least two of the plurality of inner conductive layers directly connected to the shielding layer may be connected to each other through a conductive via in the substrate. In this case, the inner conductive layers have a uniform potential all over the inner conductive layers, and the resistivity of the inner conductive layers can be reduced.

As described previously, in a circuit module according to a preferred embodiment of the present invention, a plurality of inner conductive layers are disposed in a substrate and at least two of the inner conductive layers are directly connected to a shielding layer. Accordingly, a combined resistance (R) generated by the shielding layer and the inner conductive layers directly connected to the shielding layer is small.

That it, the combined resistance (R) is represented by the following equation (1):

$$R = 1/(1/R_S + 1/R_{IE1} + 1/R_{IE2} + \ldots R_{IEN}) \qquad (1)$$

In equation (1), R denotes a combined resistance, $R_S$ denotes the resistance of a shielding layer, $R_{IE1}$ denotes the resistance of a first inner conductive layer, $R_{IE2}$ denotes the resistance of a second inner conductive layer, and $R_{IEN}$ denotes the resistance of an Nth inner conductive layer.

As is apparent from equation (1), the larger the number of inner conductive layers connected to a shielding layer, the smaller the combined resistance R. In a circuit module according to a preferred embodiment of the present invention, since at least two of inner conductive layers are directly connected to a shielding layer, the combined resistance R generated by the shielding layer and the inner conductive layers directly connected to the shielding layer is small.

As a result, a circuit module according to a preferred embodiment of the present invention can sufficiently ground electrostatic noise externally received by a shielding layer. An inner circuit is not therefore affected by the electrostatic noise. In addition, electrostatic noise generated in the inner circuit in the circuit module can be sufficiently grounded and is not externally transmitted.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the accompanying drawings.

First Preferred Embodiment

Figure 1A:
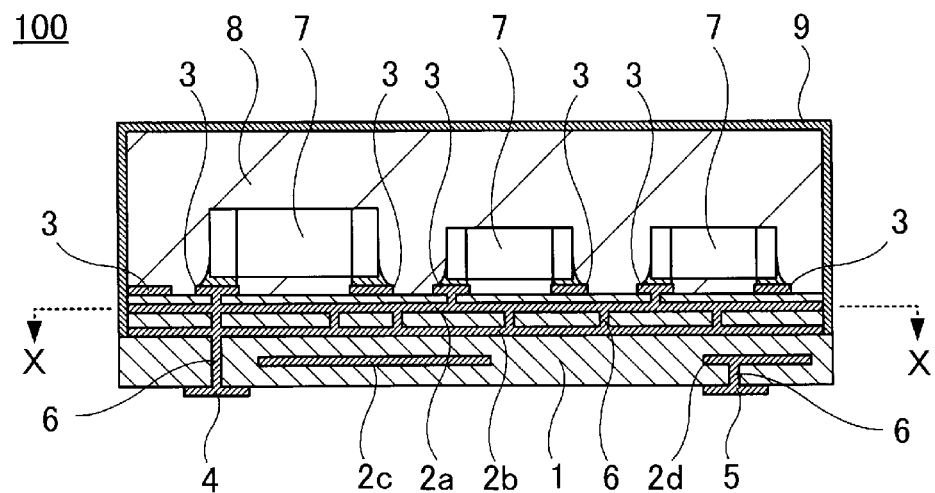
FIG. 1A is a cross-sectional view of a circuit module according to a first preferred embodiment of the present invention.
Figure 1B:
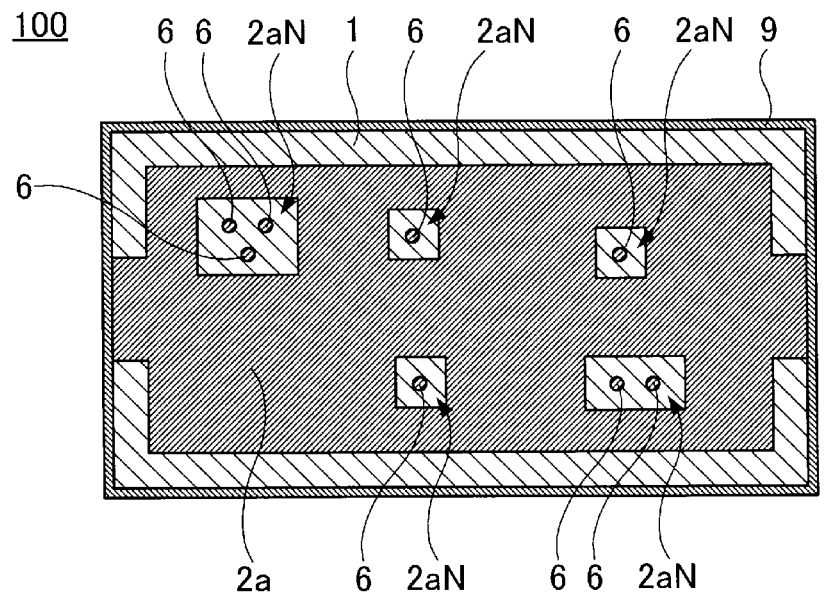
FIG. 1B is a partial cross-sectional view of the circuit module taken along a broken arrow X-X of FIG. 1A.

FIGS. 1A and 1B are diagrams illustrating a circuit module 100 according to the first preferred embodiment of the present invention. FIG. 1A is a cross-sectional view of the circuit module 100. FIG. 1B is a partial cross-sectional view of the circuit module 100 taken along a broken arrow X-X of FIG. 1A.

The circuit module 100 includes a substrate 1.

The substrate 1 may be made of any material, and can be made of, for example, low-temperature sintering ceramic containing the mixture of alumina and glass.

In the substrate 1, a plurality of inner conductive layers 2a, 2b, 2c, and 2d are disposed. On one main surface of the substrate 1, a plurality of land electrodes 3 are disposed. On the other main surface of the substrate 1, a ground electrode 4 and a terminal electrode 5 are disposed. In the substrate 1, a plurality of via electrodes 6 are disposed. Predetermined portions of the inner conductive layers 2a to 2d, the land electrodes 3, the ground electrode 4, and the terminal electrode 5 are connected to one another through the via electrodes 6. In particular, the inner conductive layers 2a and 2b are connected to each other through the via electrodes 6. The inner conductive layers 2a to 2d, the land electrodes 3, the ground electrode 4, the terminal electrode 5, and the via electrodes 6 may be made of any material, and can be made of, for example, silver or a silver alloy.

As described previously, FIG. 1B is a partial cross-sectional view of the circuit module 100 taken along the broken arrow X-X of FIG. 1A. Referring to FIG. 1B, the inner conductive layer 2a is provided. As is apparent from FIG. 1B, the outer edge of the inner conductive layer 2a is inside the outer edge of the substrate 1. The inner conductive layer 2a is exposed to the outside on the end surfaces of the substrate 1 facing each other (end surfaces on the left and right sides of the drawing). At the inner conductive layer 2a, a plurality of non-formation portions 2aN are arranged so as to allow the via electrodes 6 serving as conductive pathways between an upper layer and a lower layer to pass through the inner conductive layer 2a. The inner conductive layer 2b preferably has a structure that is the same as or similar to that of the inner conductive layer 2a.

On the land electrodes 3 on one main surface of the substrate 1, a plurality of electronic components 7 are mounted by soldering, for example. The electronic components 7 are connected via wiring lines defined by the via electrodes 6 and the inner conductive layers 2 in the substrate 1, and define an electronic circuit. A predetermined portion of the electronic circuit extends to the ground electrode 4 and the terminal electrode 5.

On one main surface of the substrate 1, an insulating layer 8 made of a resin is arranged so that it covers the electronic components 7. The insulating layer 8 is disposed on the substantially entire surface of the substrate 1. The insulating layer 8 may be made of any type of resin, and can be made of, for example, an epoxy resin.

On the surface of the insulating layer 8 and a portion of the end surfaces of the substrate 1, a shielding layer 9 is disposed. The inner conductive layers 2a and 2b, which are exposed to the outside on the end surfaces of the substrate 1, are directly connected to the shielding layer 9 on the end surfaces of the substrate 1. In this preferred embodiment, one (the leftmost one in FIG. 1A) of the land electrodes 3 disposed on one main surface of the substrate 1 preferably is also directly connected to the shielding layer 9. The shielding layer 9 is made of, for example, silver paste.

In the circuit module 100 according to the first preferred embodiment, two inner conductive layers, the inner conductive layers 2a and 2b, are connected to the shielding layer 9. A combined resistance generated by the shielding layer 9 and the inner conductive layers 2a and 2b is small. As a result, electrostatic noise externally received by the shielding layer 9 can be sufficiently grounded and an inner circuit is not affected by the electrostatic noise. In addition, electrostatic noise generated in the inner circuit in the circuit module can be sufficiently grounded via the shielding layer 9 and is not externally transmitted.

The circuit module 100 according to the first preferred embodiment having the above-described structure is manufactured by the process illustrated in FIGS. 2A to 3F. In this preferred embodiment, a non-limiting example of a method of manufacturing many circuit modules 100 at a time with a motherboard will be described.

Figure 2A:
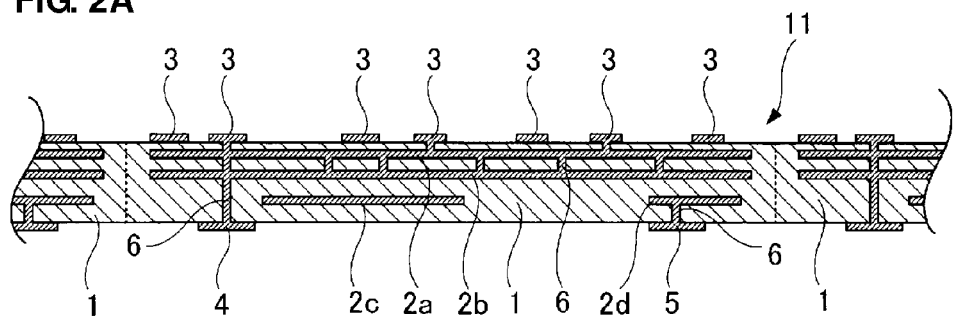
FIGS. 2A to 2C are cross-sectional views illustrating an exemplary manufacturing process of a circuit module according to the first preferred embodiment of the present invention.

First, as illustrated in FIG. 2A, a motherboard 11 in which many substrates 1 are formed in matrix is prepared. Referring to the drawings, the boundary between the substrates 1 in the motherboard 11 is represented by a broken line. For example, the motherboard 11 is created preferably by laminating a plurality of predetermined ceramic green sheets (not illustrated), applying pressure to the laminate, and baking the laminate in accordance with a predetermined profile. In each of the ceramic green sheets, in order to form the via electrodes 6, through holes that extend from one main surface to the other main surface of the ceramic green sheet and are filled with conductive paste are formed in advance as necessary before laminating. In addition, in order to form the inner conductive layers 2a to 2d, the land electrodes 3, the ground electrode 4, and the terminal electrode 5, conductive paste is printed on the ceramic green sheets in advance as necessary.

Figure 2B:
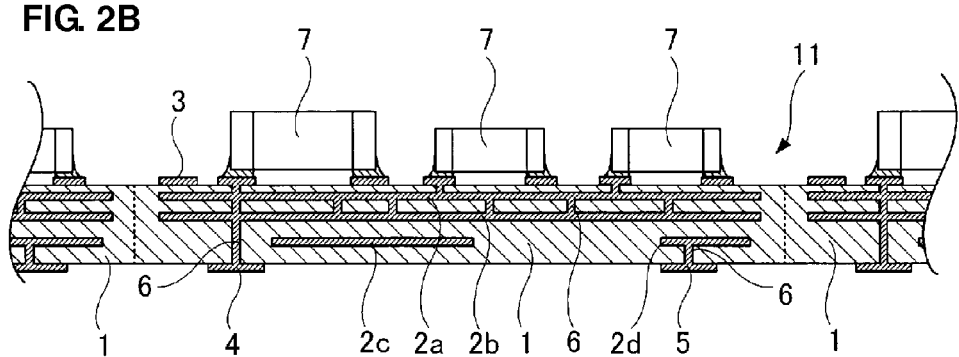

Subsequently, as illustrated in FIG. 2B, on the land electrodes 3 on each of the substrates 1 in the motherboard 11, the electronic components 7 are mounted. For example, the mounting of the electronic components 7 is performed in such a manner that solder cream is applied to the surfaces of the land electrodes 3 in advance, the electronic components 7 are placed on the land electrodes 3, and the land electrodes 3, the electronic components 7, and the solder cream are heated for reflowing and are then cooled for the connection of terminal electrodes of the electronic components 7 to the land electrodes 3.

Figure 2C:
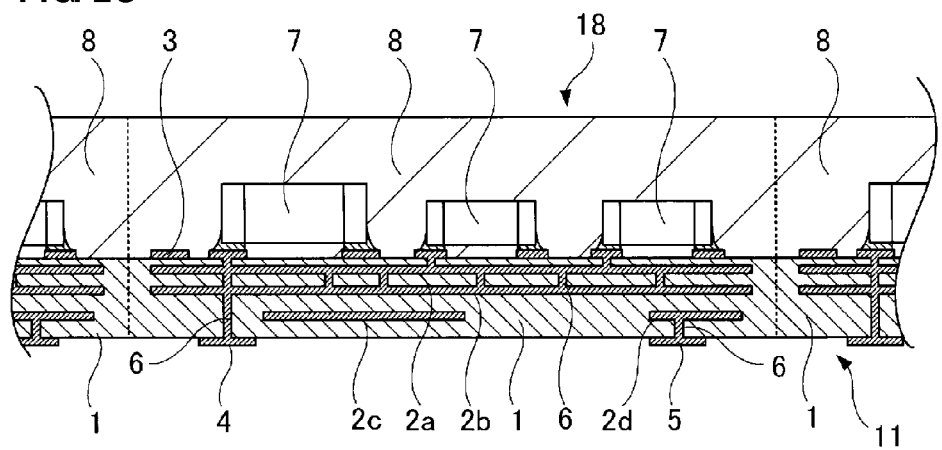

Subsequently, as illustrated in FIG. 2C, on one main surface of the motherboard 11, a mother insulating layer 18 is formed so that it covers the electronic components 7. The mother insulating layer 18 includes the insulating layers 8 of the circuit modules 100 to be manufactured at the same time. Referring to the drawing, the boundary between the insulating layers 8 in the mother insulating layer 18 is represented by a broken line. For example, the mother insulating layer 18 is formed by placing a resin sheet, which has been heated so as to be in a semi-molten state, on one main surface of the motherboard 11 so that it surrounds the electronic components 7, and heating the resin sheet until the resin sheet hardens.

Figure 3D:
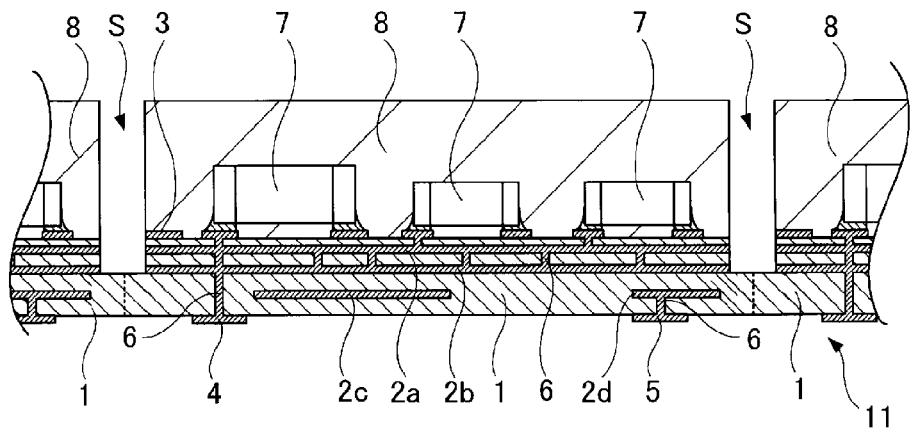
FIGS. 3D to 3F are cross-sectional views illustrating the exemplary manufacturing process (continued from FIG. 2C).

Subsequently, as illustrated in FIG. 3D, grooves S are formed at the boundaries between the circuit modules 100 to be manufactured at the same time. The grooves S separate the mother insulating layer 18 into the insulating layers 8, but do not completely separate the motherboard 11 into the substrates 1. That is, the substrates 1 that are adjacent to each other are partially connected. As a result, the inner conductive layers 2a and 2b are exposed on the end surfaces of each of the substrates 1 which face each other. For example, the grooves S are formed by dicing.

Figure 3E:
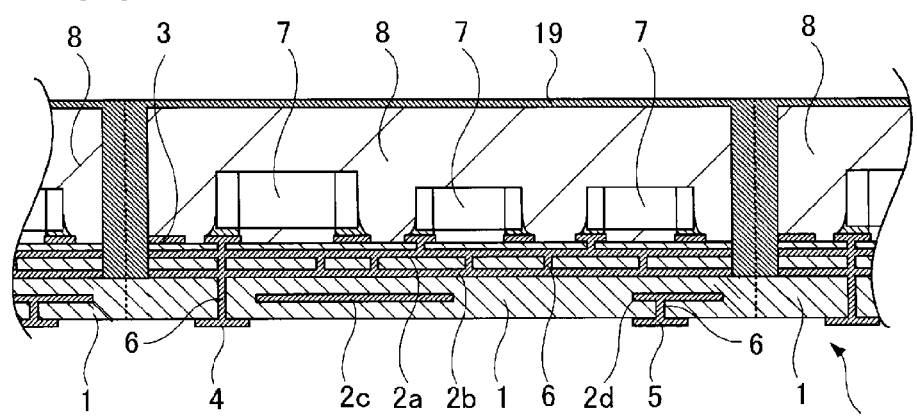

Subsequently, as illustrated in FIG. 3E, on the surface of each of the insulating layers 8 and in each of the grooves S, a conductive material 19 is formed. The conductive material 19 is used to form the shielding layer 9 of each of the circuit modules 100. Referring to the drawing, the boundary between the shielding layers 9 in the conductive material 19 is represented by a broken line. For example, the conductive material 19 is formed by applying conductive paste to the surfaces of the insulating layers 8 by spin coating, filling the grooves S with conductive paste, and heating the conductive paste until the conductive paste hardens. The conductive material 19 is connected to the inner conductive layers 2a and 2b exposed on the end surfaces of each of the substrates 1 which face each other.

Figure 3F:
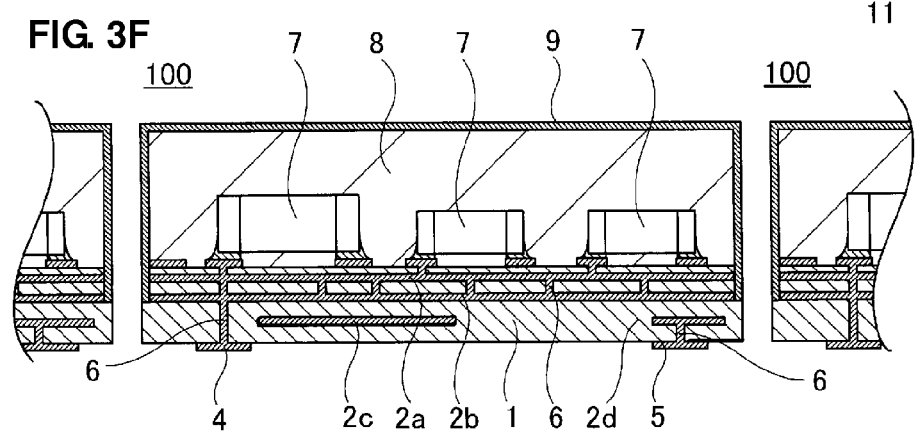

Finally, as illustrated in FIG. 3F, the conductive material 19 and the motherboard 11 are cut. As a result, the circuit modules 100 in each of which the shielding layer 9 are formed on the surface of the insulating layer 8 and a portion of the end surfaces of the substrate 1 are created. For example, the cutting of the conductive material 19 and the motherboard 11 is performed by dicing.

An exemplary structure and an exemplary manufacturing method of the circuit module 100 according to the first preferred embodiment of the present invention have been described. However, the present invention is not limited to the above-described first preferred embodiment, and various changes can be made within the spirit and scope of the present invention.

In the circuit module 100, two layers, the inner conductive layers 2a and 2b, preferably are directly connected to the shielding layer 9. However, for example, more than two inner conductive layers may be directly connected to the shielding layer 9.

As illustrated in FIG. 1B, in the circuit module 100, the inner conductive layer 2a is preferably exposed on the end surfaces of the substrate 1 which face each other and the exposed portion of the inner conductive layer 2a has a predetermined width and is directly connected to the shielding layer 9. However, a method of connecting the inner conductive layer 2a to the shielding layer 9 and a point of connection between the inner conductive layer 2a and the shielding layer 9 are not limited to the above-described method and the above-described point of connection, respectively.

Figure 4A:
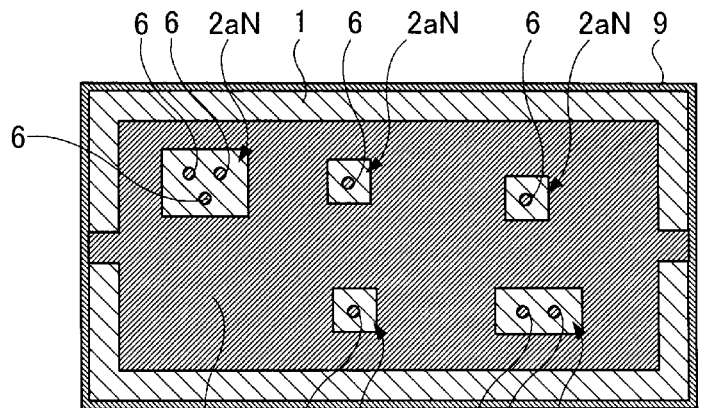
FIGS. 4A to 4C are cross-sectional views of modifications of the circuit module according to the first preferred embodiment of the present invention.

For example, as illustrated in FIG. 4A, the exposed portion of the inner conductive layer 2a on the opposite end surfaces of the substrate 1 may have a small width.

Figure 4B:
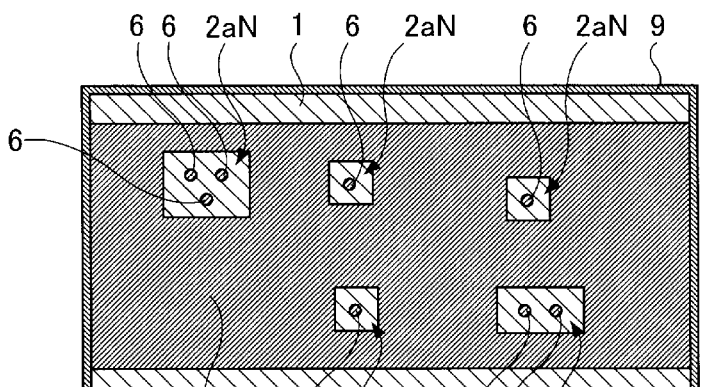

In contrast, as illustrated in FIG. 4B, the exposed portion of the inner conductive layer 2a on the opposite end surfaces of the substrate 1 may have a large width.

Figure 4C:
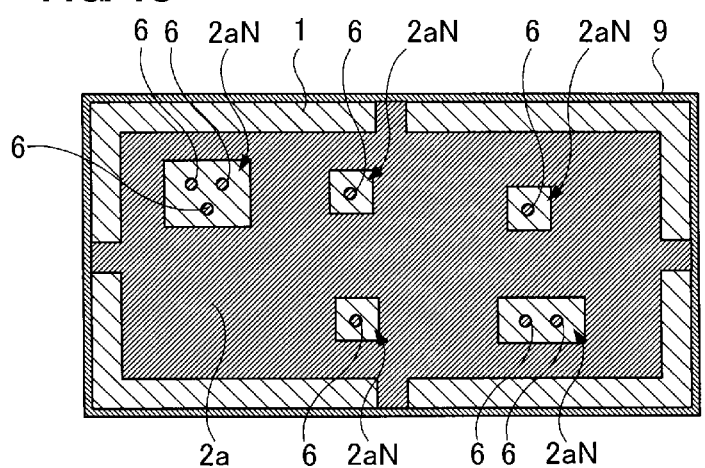

As illustrated in FIG. 4C, the inner conductive layer 2a may be exposed on four end surfaces of the substrate 1 and the exposed portion of the inner conductive layer 2a may be directly connected to the shielding layer 9.

Figure 5A:
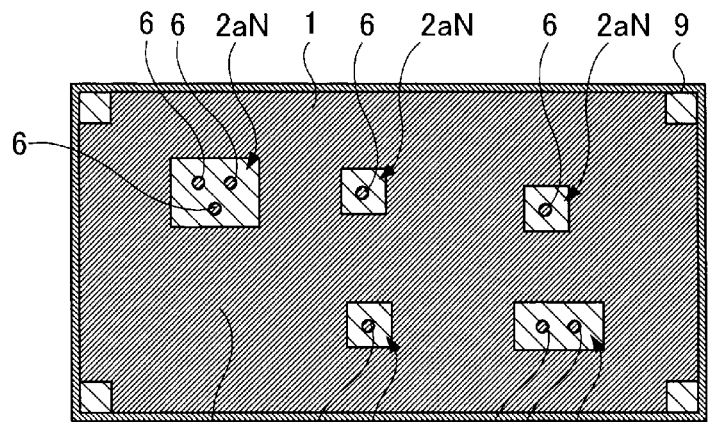
FIGS. 5A to 5C are cross-sectional views of other modifications of the circuit module according to the first preferred embodiment of the present invention.

As illustrated in FIG. 5A, the exposed portion of the inner conductive layer 2a on the end surfaces of the substrate 1 illustrated in FIG. 4C may have a large width.

Figure 5B:
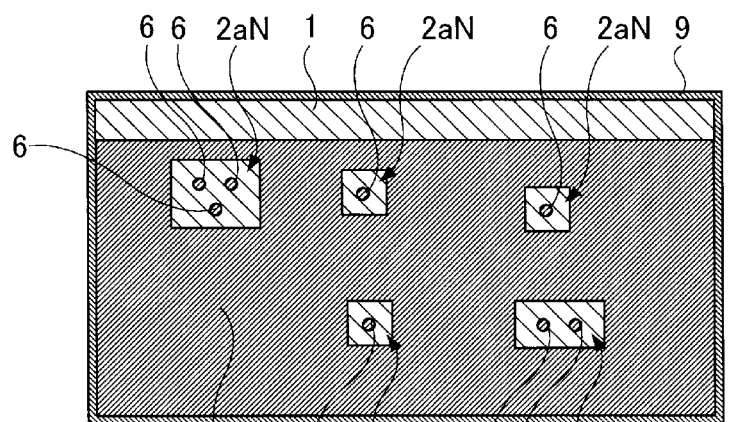

As illustrated in FIG. 5B, the inner conductive layer 2a may be exposed on three end surfaces of the substrate 1 and the exposed portion of the inner conductive layer 2a may be directly connected to the shielding layer 9.

Figure 5C:
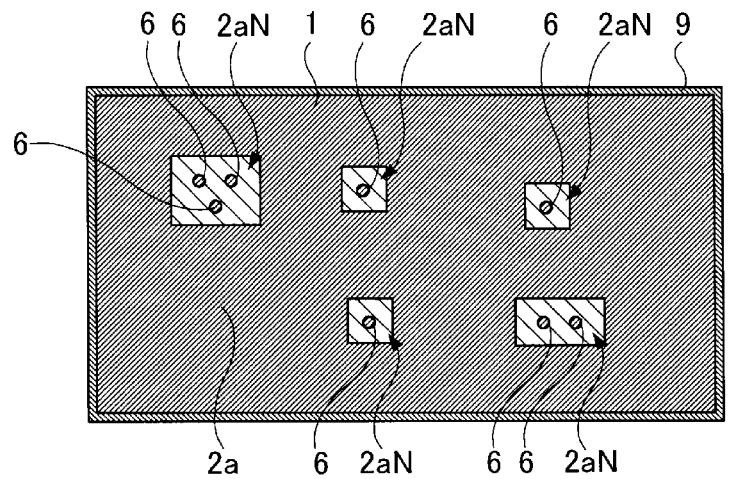

As illustrated in FIG. 5C, the inner conductive layer 2a may be exposed around the entire circumference of the substrate 1 and the exposed portion of the inner conductive layer 2a may be directly connected to the shielding layer 9.

When the inner conductive layer 2a is exposed on three or four end surfaces of the substrate 1 and the exposed portion of the inner conductive layer 2a is connected to the shielding layer 9 as described previously, the electronic components 7 are surrounded by the shielding layer 9 and the inner conductive layer 2a. Accordingly, the electronic components 7 are not affected by an external noise signal and do not externally transmit a noise signal from a circuit module.

Second Preferred Embodiment

Figure 6:
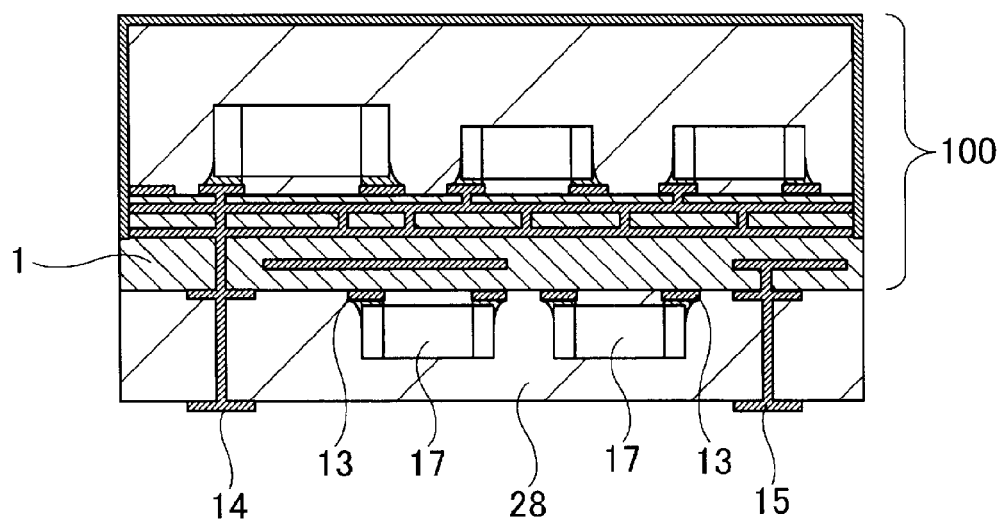
FIG. 6 is a cross-sectional view of a circuit module according to a second preferred embodiment of the present invention.
Figure 7:
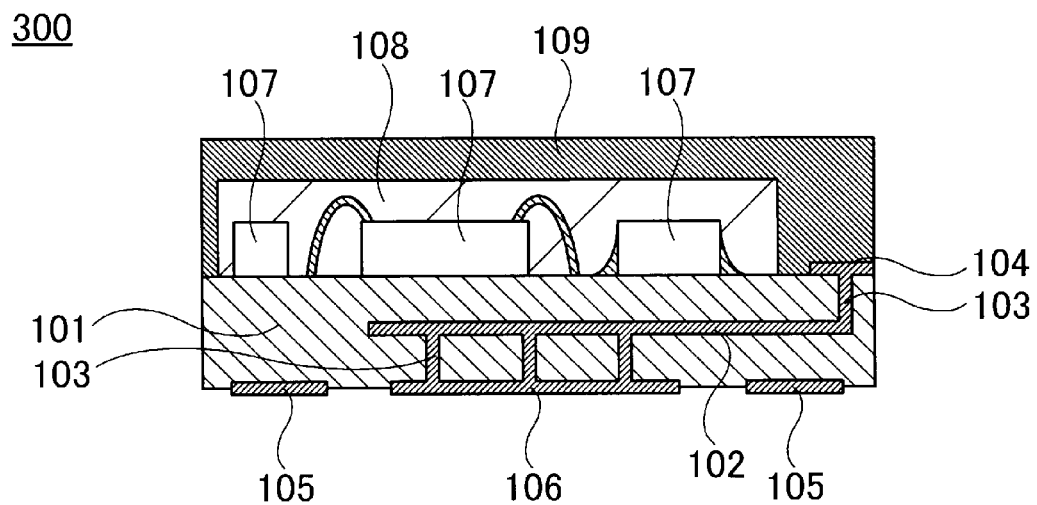
FIG. 7 is a cross-sectional view of a circuit module in the related art.

A circuit module 200 according to the second preferred embodiment of the present invention is illustrated in FIG. 6. FIG. 6 is a cross-sectional view of the circuit module 200.

In the circuit module 200 according to the second preferred embodiment, on the mounting surface (the lower main surface illustrated in FIG. 1A) of the substrate 1 in the circuit module 100 according to the first preferred embodiment illustrated in FIGS. 1A and 1B, other electronic components are disposed and an additional insulating layer covering the other electronic components is provided.

That is, as illustrated in FIG. 6, in the circuit module 200, land electrodes 13 are disposed on the mounting surface of the substrate 1 in the circuit module 100. Electronic components 17 are mounted on the land electrodes 13. An insulating layer 28 is arranged so that it covers the electronic components 17. On the surface of the insulating layer 28, a ground electrode 14 and a terminal electrode 15 are disposed.

The disposition of the electronic components 17 on the substrate 1 and the formation of the insulating layer 28 may be performed before the motherboard 11 is separated into the substrates 1 as described previously in the first preferred embodiment with reference to FIGS. 2C and 3D, or may be performed after the conductive material 19 and the motherboard 11 have been cut into the circuit modules 100 as described previously in the first preferred embodiment with reference to FIG. 3F.

In the circuit module 200 according to the second preferred embodiment, many electronic components can be disposed on a substrate. According to the second preferred embodiment, a sophisticated circuit module including a complex electronic circuit can be provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit module comprising:
   a substrate that has a substantially rectangular parallelepiped shape and includes a plurality of inner conductive layers;
   an electronic component disposed on a first main surface of the substrate;
   an insulating layer disposed on the first main surface of the substrate so as to cover the electronic component;
   a shielding layer disposed on a surface of the insulating layer; and
   a ground electrode connected to the plurality of inner conductive layers; wherein
   at least two of the plurality of inner conductive layers are directly connected to the shielding layer;
   a periphery of each of the at least two of the plurality of inner conductive layers includes at least one exposed portion that is exposed from a side of the substrate and directly connected to the shielding layer and at least one recessed portion that is spaced inwardly away from the side of the substrate.

2. The circuit module according to claim 1, wherein the at least one exposed portion of each of the at least two of the plurality of inner conductive layers includes exposed portions that are exposed on end surfaces of the substrate which face each other.

3. The circuit module according to claim 2, wherein the at least one exposed portion of each of the at least two of the plurality of inner conductive layers includes exposed portions that are exposed on three or four end surfaces of the substrate.

4. The circuit module according to claim 1, wherein the insulating layer is disposed on an entire main surface of the substrate.

5. The circuit module according to claim 1, wherein the ground electrode is disposed on a second main surface of the substrate on which the electronic component is not disposed.

6. The circuit module according to claim 1, wherein an additional electronic component is disposed on the second main surface of the substrate on which the electronic component is not disposed, an additional insulating layer is disposed on the second main surface of the substrate such that the additional insulating layer covers the additional electronic component, and the ground electrode is disposed on a surface of the additional insulating layer.

7. The circuit module according to claim 1, wherein the at least two of the plurality of inner conductive layers that are directly connected to the shielding layer are connected to each other through a conductive via in the substrate.

* * * * *